United States Patent
Kunze et al.

(10) Patent No.: US 11,007,606 B2
(45) Date of Patent: May 18, 2021

(54) METHOD FOR LONG-TERM STORAGE OF INFORMATION AND STORAGE MEDIUM THEREFOR

(71) Applicant: Ceramic Data Solution GmbH, Gmunden (AT)

(72) Inventors: Martin Kunze, Gmunden (AT); Christian Pflaum, Bernried (DE)

(73) Assignee: Ceramic Data Solution GMBH, Gmunden (AT)

( * ) Notice: Subject to any disclaimer, the term of this patent is extended or adjusted under 35 U.S.C. 154(b) by 0 days.

(21) Appl. No.: 16/912,219

(22) Filed: Jun. 25, 2020

(65) Prior Publication Data

US 2021/0046588 A1     Feb. 18, 2021

Related U.S. Application Data

(63) Continuation of application No. PCT/EP2019/071805, filed on Aug. 14, 2019.

(51) Int. Cl.
*B23K 26/362* (2014.01)
*B23K 26/352* (2014.01)
(Continued)

(52) U.S. Cl.
CPC .......... *B23K 26/362* (2013.01); *B23K 26/352* (2015.10); *B23K 26/364* (2015.10);
(Continued)

(58) Field of Classification Search
CPC .. B23K 26/352; B23K 26/362; B23K 26/364; C23C 14/5873; C23C 14/5853;
(Continued)

(56) References Cited

U.S. PATENT DOCUMENTS

| 4,069,487 A | 1/1978 | Kasai et al. |
| 4,214,249 A * | 7/1980 | Kasai ..................... B23K 26/18 148/DIG. 93 |

(Continued)

FOREIGN PATENT DOCUMENTS

| DE | 19724214 | 12/1998 |
| DE | 102014118497 B4 | 6/2017 |

(Continued)

OTHER PUBLICATIONS

Webster's Ninth New Collegiate Dictionary; Merrian-Webster Inc.; Springfield, Mass, USA; 1990 ( no month); excerpt p. 224.*

(Continued)

*Primary Examiner* — Dah-Wei D. Yuan
*Assistant Examiner* — Kristen A Dagenais-Englehart
(74) *Attorney, Agent, or Firm* — Lewis & Reese, PLLC (57) ABSTRACT

The present invention relates to an information storage medium and a method for long-term storage of information comprising the steps of: providing a ceramic substrate; coating the ceramic substrate with a layer of a second material different from the material of the ceramic substrate, the layer having a thickness no greater than 10 μm; tempering the coated ceramic substrate to form a writable plate or disc; encoding information on the writable plate or disc by using a laser and/or a focused particle beam to manipulate localized areas of the writable plate or disc.

11 Claims, 3 Drawing Sheets

(51) Int. Cl.
*B23K 26/364* (2014.01)
*C23C 14/58* (2006.01)
*C23C 16/48* (2006.01)
*C23C 16/56* (2006.01)

(52) U.S. Cl.
CPC ........ *C23C 14/582* (2013.01); *C23C 14/5813* (2013.01); *C23C 14/5833* (2013.01); *C23C 14/5853* (2013.01); *C23C 14/5873* (2013.01); *C23C 16/48* (2013.01); *C23C 16/483* (2013.01); *C23C 16/486* (2013.01); *C23C 16/56* (2013.01); *C23C 16/487* (2013.01)

(58) Field of Classification Search
CPC .............. C23C 14/5833; C23C 14/582; C23C 14/5813; C23C 16/48; C23C 16/483; C23C 16/486; C23C 16/487; C23C 16/56
USPC .......................... 427/552, 555, 556, 375–380
See application file for complete search history.

(56) References Cited

U.S. PATENT DOCUMENTS

| | | | |
|---|---|---|---|
| 4,556,893 A | 12/1985 | Rinehart et al. | |
| 6,133,986 A | 10/2000 | Johnson | |
| 6,143,468 A * | 11/2000 | Ohno | G11B 7/0045 369/275.2 |
| 10,315,276 B2 | 6/2019 | Wagner et al. | |
| 2003/0189228 A1 * | 10/2003 | Ieong | H01L 29/66545 257/347 |
| 2006/0120262 A1 | 6/2006 | Kiyono | |
| 2015/0382476 A1 * | 12/2015 | Zenou | H05K 3/027 427/510 |
| 2016/0199935 A1 | 7/2016 | Chen et al. | |
| 2019/0273025 A1 | 9/2019 | Chen et al. | |
| 2019/0353912 A1 | 11/2019 | Chen et al. | |

FOREIGN PATENT DOCUMENTS

| | | |
|---|---|---|
| EP | 3031785 B1 | 10/2018 |
| JP | 6689067 B2 | 4/2020 |
| WO | 91/13440 | 9/1991 |

OTHER PUBLICATIONS

Espacenet machine translation of DE 19724214 A1, published Dec. 10, 1998, by Winnacker et al.*
"Glass Composition, Glass Types" retrieved Dec. 17, 2020 from website ://glassproperties.com/glasses.*
Webster's Ninth New Collegiate Dictionary; Merrian-Webster Inc.; Springfield, Mass, USA; 1990 ( no month); excerpt p. 224. (Year: 1990).*
Espacenet machine translation of DE 19724214 A1, published Dec. 10, 1998, by Winnacker et al. (Year: 1998).*
"Glass Composition, Glass Types" retrieved Dec. 17, 2020 from website ://glassproperties.com/glasses (Year: 2020).*
Qi, Z.B., et al., *Thin Solid Films*, 544, 2013, pp. 515-520.
International Search Report regarding corresponding PCT Application No. PCT/EP2019/071805, dated May 26, 2020.
Rectified Written Opinion regarding corresponding PCT Application No. PCT/EP2019/071805, dated Jun. 16, 2020.
European Search Report regarding corresponding EP Application No. 20190446, dated Jan. 19, 2021.

* cited by examiner

METHOD FOR LONG-TERM STORAGE OF INFORMATION AND STORAGE MEDIUM THEREFOR

CROSS-REFERENCE TO RELATED APPLICATIONS

This is a continuation of International (PCT) application Serial No. PCT/EP2019/071805, filed Aug. 14, 2019, to which priority is claimed, and which is incorporated herein by reference in its entirety.

INTRODUCTION

The invention relates to a method for long-term storage of information and to an information storage medium for long-term storage.

Currently there are a wide variety of information storage options available to choose from. With the arrival of the digital era the need for cheap and efficient information storage systems has been acute and numerous new technologies have emerged. The proliferation of information storage mechanisms, however, has come with certain unforeseen consequences. Today's information storage systems are highly fragile and susceptible to damage. Storage mediums such as hard drives and optical disks have life spans of merely tens of years, and only when they are properly preserved and maintained. Even older technologies, such as paper and microfilm have lifespans of only centuries under the best circumstances. All of these information storage technologies are sensitive to heat, moisture, acid, etc. and can thus be easily degraded resulting in information loss.

As the need for data storage grows exponentially, the methods used for storing data have become increasingly vulnerable to destruction and susceptible to the passage of time. However, many types of information should be preserved against natural degradation to ensure continuation of information for generations to come. In the event of natural disasters, such as, for example, strong electro-magnetic radiation emitted by the sun, tremendous amounts of data could potentially be damaged or destroyed. Thus, there is a need for information storage that is resistant to environmental degradation and can thus store information over long periods of time.

SUMMARY

It is an object of the present invention to provide a method and medium for long term information storage.

This objective is achieved with the features of the independent claims. Dependent claims refer to preferred embodiments.

According to a first aspect, the invention relates to a method for long-term storage of information. The method comprises the steps of providing a ceramic substrate; coating the ceramic substrate with a layer of a second material, the layer having a thickness no greater than 10 μm; tempering the coated ceramic substrate to form a writable plate; and encoding information on the writable plate by using, e.g., a laser or a focused particle beam (e.g., a focused ion beam, a focused electron beam or the like) to manipulate localized areas of the writable plate.

Manipulating the localized areas of the writable plate may comprise heating, decomposing, oxidizing, ablating and/or vaporizing the localized areas of the writable plate. If a laser is being used, the laser will typically heat the impact areas of the laser beam which, in turn, may cause decomposition, oxidization, ablation and/or vaporization of the material within or close to the impact areas. In case of a focused particle beam, other mechanisms may be involved. For example, the impact of a focused ion beam may directly cause ablation of atoms from the impact areas.

Manipulating the localized areas of the writable plate encodes information on the writable plate. This encoding can be based on a variety of physical and/or chemical processes. Preferably, said manipulation causes the localized areas to become distinguishable from the surrounding material. For some applications, this may comprises to achieve optical distinguishability. However, in other instances (in particular, if the encoded structures are too small) the localized areas may only be distinguished from the surrounding material by means of, e.g., a scanning electron microscope or measurement of another physical parameter change for example of magnetic, dielectric or conductive properties.

The term "optically distinguishable" may relate to distinguishable by the naked eye due to a contrast in color and/or darkness/brightness and/or reflection. However, the term also encompasses optical differences in an optical spectrum beyond the visible spectrum such as the infrared and/or ultraviolet spectrum. The localized areas may then be optically distinguishable by means of an optical reader or scanner being sensitive in the respective portion of the spectrum. The optical distinguishability may be measured using, e.g., Weber contrast, wherein the Weber contrast fraction of the information encoded on the writable plate is preferably at least 1%, more preferably at least 3%, even more preferably at least 5%. For structures below 200 nm, generated by, e.g., highly focused particle beams, even the ultraviolet spectrum might not yield satisfying results. In these cases a scanning electron microscope (SEM) might be used to scan the information encoded on a nanometer level. In case, other than optical parameters (e.g., magnetic, dielectric or conductive properties) are measured for decoding, Weber contrast may be applied in an analogous manner. For example, it may be preferred that a physical parameter p is used for encoding. It is then preferred that $1-p_{min}/p_{max}$ amounts to at least 1%, more preferably at least 3%, even more preferably at least 5%, wherein $p_{min}$ and $p_{max}$ relate to the minimum and maximum, respectively, of the parameter p over the entire writable plate.

The layer of the second material is preferably coated directly onto the ceramic substrate, i.e. without any intermediate layer being present, so as to achieve a strong bond between the ceramic substrate and the layer of the second material during tempering. However, tempering may generate a sintered interface between the ceramic substrate and the layer of the second material. The sintered interface may comprise at least one element from both the substrate material and the second material because one or more elements from one of the two adjacent layers may diffuse into the other layer of the two adjacent layers. The presence of the sintered interface may further strengthen the bond between the ceramic substrate and the layer of the second material.

The layer of second material is preferably continuous and preferably extends over a large portion (e.g., at least 80% or at least 90%) of, more preferably the entire ceramic substrate. This allows for the same optical contrast between the localized areas on the one hand and a large portion or the entire substrate on the other hand. Preferably, the second material is different from the material of the ceramic substrate, i.e. the second material may have a different elemental composition than the material of the ceramic substrate or the second material and the ceramic substrate differ in terms of their microscopic structure, e.g. their state of crystallization or the like. However, the invention merely requires an optical contrast after manipulating of the localized areas. Thus, it may be sufficient if the manipulated material is optically distinguishable from the surrounding material. In some cases, however, the optical contrast may be due to removal of the material in the localized areas. The skilled person will understand that the contrast may also be achieved by other physical parameters as outlined above.

Tempering is a process which can be performed on certain materials, such as ceramics and metals, to improve their durability by altering the material's underlying physical or chemical properties. The tempering process may assist in fixing the second material permanently to the ceramic substrate. In some cases, a portion of the second material layer may form a chemical bond to the underlying ceramic substrate, such as for example an inter-metallic or inter-ceramic bond. Tempering may improve the adhesion between substrate and second material as well as the hardness of the layer of second material by at least 5%, preferably by at least 10%. Moreover, tempering may create a sintered interface as discussed above.

If tempering is performed in an atmosphere containing oxygen, the surface or a topmost sub-layer of the layer of the second material exposed to oxygen may, at least partly, be oxidized. Thus, a metal oxide layer may be formed on top of the layer of the second material. This may further increase the hardness and/or the melting point and/or the resistance against corrosive environment.

A laser or a focused particle beam (e.g. focused ion beam, focused electron beam) of sufficient power can be used to alter localized areas of the second material (and optionally the metal oxide layer) such that they preferably become distinguishable from the surrounding portions of material. Depending on the specific material used for the second material, the localized areas may be heated, decomposed, oxidized, ablated and/or vaporized by the incident laser light or particle beam. Thus, a layer of second material less than 10 μm thick allows these localized areas to be easily and quickly altered by the laser light or particle beam. During experiments it has turned out that it is much more difficult to precisely encode information if layers extending a thickness of 10 μm are used. However, according to another aspect of the present invention, the thickness of the layer of the second material is greater than 10 μm.

Providing a writable plate with a tempered ceramic substrate coated with a layer of second material as described herein allows for information storage thereon which is highly resistant to moisture, electric/magnetic fields, acidic, corrosive substance, etc. such that the encoded writable plate provides a durability which is unavailable from other commonly used information storage mediums.

Preferably, the ceramic substrate of the method for long-term information storage comprises an oxidic ceramic, more preferably the ceramic substrate comprises at least 90%, most preferably at least 95%, by weight of one or a combination of $Al_2O_3$, $TiO_2$, $SiO_2$, $ZrO_2$, $ThO_2$, MgO, $Cr_2O_3$, $Zr_2O_3$, $V_2O_3$ or any other oxidic ceramic material. These materials are known to be particularly durable under various circumstances and/or to resist environmental degradation. Thus, these materials are particularly suitable for long-term storage under different conditions. It is particularly preferred that the ceramic substrate comprises one or a combination of $Al_2O_3$, $ZrO_2$, $ThO_2$, and/or MgO.

Preferably, the ceramic substrate comprises a non-oxidic ceramic, more preferably the ceramic substrate comprises at least 90%, most preferably at least 95%, by weight of one or a combination of a metal nitride such as CrN, CrAlN, TiN, TiCN, TiAlN, ZrN, AlN, VN, $Si_3N_4$, ThN, HfN, BN; metal carbide such as TiC, CrC, $Al_4C_3$, VC, ZrC, HfC, ThC, $B_4C$, SiC; a metal boride such as $TiB_2$, $ZrB_2$, $CrB_2$, $VB_2$, $SiB_6$, $ThB_2$, $HfB_2$, $WB_2$, $WB_4$ and a metal silicide such as $TiSi_2$, $ZrSi_2$, $MoSi_2$, $WSi_2$, PtSi, $Mg_2Si$ or any other non-oxidic ceramic material. These materials are known to be particularly durable under various circumstances and/or to resist environmental degradation. Thus, these materials are particularly suitable for long-term storage under different conditions. It is particularly preferred that the ceramic substrate comprises one or a combination of BN, $CrSi_2$, SiC, and/or $SiB_6$.

Preferably, the ceramic substrate comprises one or a combination of Ni, Cr, Co, Fe, W, Mo or other metals with a melting point above 1,400° C. Preferably, the ceramic material and the metal form a metal matrix composite with the ceramic material being dispersed in the metal or metal alloy. Preferably, the metal amounts to 5-30% by weight, preferably 10-20% by weight of the ceramic substrate, i.e. the metal matrix composite. Particularly preferred metal matrix composites are: WC/Co—Ni—Mo, BN/Co—Ni—Mo, TiN/Co—Ni—Mo and/or SiC/Co—Ni—Mo.

Preferably, the second material comprises at least one of a metal such as Cr, Co, Ni, Fe, Al, Ti, Si, W, Zr, Ta, Th, Nb, Mn, Mg, Hf, Mo, V; or a ceramic material such as a metal nitride such as CrN, CrAlN, TiN, TiCN, TiAlN, ZrN, AlN, VN, $Si_3N_4$, ThN, HfN, BN; a metal carbide such as TiC, CrC, $Al_4C_3$, VC, ZrC, HfC, ThC, $B_4C$, SiC; a metal oxide such as $Al_2O_3$, $TiO_2$, $SiO_2$, $ZrO_2$, $ThO_2$, MgO, $Cr_2O_3$, $Zr_2O_3$, $V_2O_3$; a metal boride such as $TiB_2$, $ZrB_2$, $CrB_2$, $VB_2$, $SiB_6$, $ThB_2$, $HfB_2$, $WB_2$, $WB_4$; a metal silicide such as $TiSi_2$, $ZrSi_2$, $MoSi_2$, $WSi_2$, PtSi, $Mg_2Si$; or any other ceramic material; preferably wherein the second material comprises CrN and/or CrAlN. These materials provide sufficient hardness and resistance to environmental degradation. Furthermore, said materials can provide sufficient visual contrast with the underlying ceramic substrate. Moreover, experiments have shown these materials to be strongly bonded to the substrates mentioned above once being tempered. Thus, a durable, permanent connection between the layer and the substrate may be achieved. It is particularly preferred that the second material comprises one or a combination of Co, Ni, $B_4C$, HfC, $Cr_2O_3$, $ZrB_2$, $CrB_2$, $SiB_6$, $Si_3N_4$, ThN, CrN and/or CrAlN.

In the context of the present invention, various material properties may play an important role. For one, the materials of both the substrate and the coating layer need to be sufficiently durable, stable and resistant. Moreover, a strong bond or connection between the coating layer and the substrate material is required. In addition, the layer of the second material need be suitable for manipulation by one or more of the techniques discussed herein. Finally, it is beneficial if sufficient contrast can be established utilizing the two materials. Taking all these constraints into account, the following material combinations are particularly preferred: $Al_2O_3$/CrN, $Al_2O_3$/Co, $ZrO_2$/$ZrB_2$, $Al_2O_3$/SiC, $SiB_6$/$Cr_2O_3$, SiC/HfC, BN/$ZrB_2$, BN/$ZrB_2$, BN/$B_4C$, BN/ThN and $CrSi_2$/$Si_3N_4$.

Generally, any technique suitable to achieve thin coatings may be utilized for coating the ceramic substrate with the layer of the second material, e.g. physical vapor deposition, sputtering, chemical vapor deposition, or any other thin film coating method. Preferably physical vapor deposition is used to coat the ceramic substrate with the layer of second material. This particularly allows for reliably providing very thin coating layers which continuously cover the substrate without any defects which could be misinterpreted as encoded information. Since it may be difficult to use PVD for some of the materials mentioned above it is preferred that, during physical vapor deposition, the ceramic substrate is positioned intermediate a source of the second material and an electrically conductive plate and/or wire grating. A plate or grating positioned behind the ceramic substrate helps to direct the vapor of second material to adhere to the (non-conducting) ceramic substrate.

Preferably the layer of second material has a thickness no greater than 10 µm, more preferably no greater than 5 µm, even more preferably no greater than 1 µm, even more preferably no greater than 100 nm, even more preferably no greater than 10 nm.

By providing a thin layer of the second material, the laser or particle beam removal of localized areas of the second material may be performed more quickly and effectively. Moreover, much smaller localized areas may be altered more precisely if the layer of second material is thinner. Thus, the information content per area may be improved.

Preferably tempering the coated ceramic substrate involves heating the coated ceramic substrate to a temperature within a range of 200° C. to 4,000° C., more preferably within a range of 1,000° C. to 2,000° C. The tempering process may comprise a heating phase with a temperature increase of at least 10 K per hour, a plateau phase at a peak temperature for at least 1 minute and finally a cooling phase with a temperature decrease of at least 10 K per hour. The tempering process may assist in hardening the ceramic substrate and/or permanently bonding the second material to the ceramic substrate.

Preferably the localized areas of the writable plate are heated to at least a melting temperature of the second material such that the localized areas of second material are heated to a temperature of at least 3,000° C., even more preferably at least 3,200° C., most preferably at least 3,500° C., most preferably at least 4,000° C. Laser or particle beam ablation of localized areas of the writable table may reveal the underlying ceramic substrate leading to a (optically) distinguishable contrast of the manipulated area relative to the rest of the writable plate.

Preferably the laser is configured to produce laser light having a wavelength within a range of 10 nm to 30 µm, preferably within a range of 100 nm to 2,000 nm, more preferably within a range of 200 nm to 1,500 nm.

Preferably the laser light emitted by the laser has a minimum focal diameter no greater than 50 µm, more preferably no greater than 15 µm, more preferably no greater than 10 µm, more preferably no greater than 5 µm, more preferably no greater than 1 µm, more preferably no greater than 500 nm, more preferably no greater than 100 nm. A small focal diameter allows for information to be encoded on the writable plate with a higher density.

Preferably, an ultra-short pulse laser (femtosecond or attosecond pulse) is used for encoding information. This allows for achieving minimal focal diameters no greater than 10 µm and structures no greater than 5 µm width, more preferably no greater than 1 µm, more preferably no greater than 500 nm, more preferably no greater than 100 nm.

Preferably a particle beam emitted by the focused particle beam equipment has a minimum focal diameter no greater than 5 µm, more preferably no greater than 1 µm, more preferably no greater than 100 nm, more preferably no greater than 10 nm. An extremely small focal diameter allows for information to be encoded on the writable plate with an ultra-higher density.

Preferably the method further comprises the step of reading information encoded on the writable plate, more preferably using a digital scanner, laser scanning microscope or scanning electron microscope.

Preferably the information is encoded in an analog format, more preferably a human-readable format using most preferably letters, symbols, photographs, pictures, images, graphics and/or other forms. Human-readable information has the benefit of being usable without the aid of technology.

Preferably information is encoded in a computer-readable format, more preferably wherein the information is encoded in a digital format, even more preferably wherein the information is encoded as a QR code and/or an iQR code and or any other digital coding and encryption method. Computer-readable information has the benefit of storing larger amounts of data within smaller areas and can be compatible with modern or future technologies.

Preferably areas of the writable plate comprise at least 1 kilobyte of information per $cm^2$, more preferably at least 10 kilobytes of information per $cm^2$, even more preferably at least 100 kilobytes of information per $cm^2$, even more preferably at least 1 Megabytes of information per $cm^2$, even more preferably at least 10 Megabytes of information per $cm^2$, even more preferably at least 100 Megabytes of information per $cm^2$, even more preferably at least 1 Gigabytes of information per $cm^2$, even more preferably at least 10 Gigabytes of information per $cm^2$. A greater information storage density allows for the storage of large quantities of information.

According to a second aspect, the invention relates to a method for long-term storage of information comprising the steps of providing a tungsten substrate; coating the tungsten substrate with a layer of a second material, the layer having a thickness no greater than 10 µm; tempering the coated substrate to form a writable plate; and encoding information on the writable plate by using, e.g., a laser or a focused particle beam (e.g., a focused ion beam, a focused electron beam or the like) to manipulate localized areas of the writable plate.

Since alloys of Ni, Cr, Co, Fe, W, Mo or other metals with high melting point above 1,400° C. are extremely durable materials, the benefits discussed above with regard to the ceramic substrate may also be achieved by using alloys of Ni, Cr, Co, Fe, W, Mo or other metals with high melting point above 1,400° C. as substrate material. All features discussed above with regard to the method according to the first aspect utilizing the ceramic substrate may also be employed in the context of the second aspect of the present invention by simply replacing the ceramic substrate with alloys of Ni, Cr, Co, Fe, W, Mo or other metals with high melting point above 1,400° C. as substrate.

According to a third aspect, the invention relates to an information storage medium for long-term storage of information, the information storage medium comprising a writable plate, the writable plate comprising a ceramic substrate coated with a layer of second material and a sintered interface between the ceramic substrate and the layer of the second material, wherein the second material is different from the material of the ceramic substrate, wherein the sintered interface comprises at least one element from both the substrate material and the second material, wherein the layer of the second material has a thickness no greater than 10 µm.

Preferably the ceramic substrate of the information storage medium comprises an oxidic ceramic, more preferably wherein the ceramic substrate comprises at least 90%, even more preferably at least 95%, by weight of one or a combination of $Al_2O_3$, $TiO_2$, $SiO_2$, $ZrO_2$, $ThO_2$, MgO, $Cr_2O_3$, $Zr_2O_3$, $V_2O_3$ or any other oxidic ceramic material.

Preferably, the ceramic substrate of the information storage medium comprises a non-oxidic ceramic, more preferably wherein the ceramic substrate comprises at least 90%, even more preferably at least 95%, by weight of one or a combination of a metal nitride such as CrN, CrAlN, TiN, TiCN, TiAlN, ZrN, AlN, VN, $Si_3N_4$, ThN, HfN, BN; metal carbide such as TiC, CrC, $Al_4C_3$, VC, ZrC, HfC, ThC, $B_4C$, SiC; a metal boride such as $TiB_2$, $ZrB_2$, $CrB_2$, $VB_2$, $SiB_6$, $ThB_2$, $HfB_2$, $WB_2$, $WB_4$ and a metal silicide such as $TiSi_2$, $ZrSi_2$, $MoSi_2$, $WSi_2$, PtSi, Mgt Si, or any other non-oxidic ceramic material.

It is particularly preferred that the ceramic substrate comprises one or a combination of BN, $CrSi_2$, SiC, and/or $SiB_6$.

Preferably, the ceramic substrate comprises one or a combination of Ni, Cr, Co, Fe, W, Mo or other metals with a melting point above 1,400° C. Preferably, the ceramic material and the metal form a metal matrix composite with the ceramic material being dispersed in the metal or metal alloy. Preferably, the metal amounts to 5-30% by weight, preferably 10-20% by weight of the ceramic substrate, i.e. the metal matrix composite. Particularly preferred metal matrix composites are: WC/Co—Ni—Mo, BN/Co—Ni—Mo, TiN/Co—Ni—Mo and/or SiC/Co—Ni—Mo.

Preferably the second material of the information storage medium comprises at least one of a metal such as Cr, Co, Ni, Fe, Al, Ti, Si, W, Zr, Ta, Th, Nb, Mn, Mg, Hf, Mo, V, a metal nitride such as CrN, CrAlN, TiN, TiCN, TiAlN, ZrN, AlN, VN, $Si_3N_4$, ThN, HfN, BN; a metal carbide such as TiC, CrC, $Al_4C_3$, VC, ZrC, HfC, ThC, $B_4C$, SiC; a metal oxide such as $Al_2O_3$, $TiO_2$, $SiO_2$, $ZrO_2$, $ThO_2$, MgO, $Cr_2O_3$, $Zr_2O_3$, $V_2O_3$; a metal boride such as $TiB_2$, $ZrB_2$, $CrB_2$, $VB_2$, $SiB_6$, $ThB_2$, $HfB_2$, $WB_2$, $WB_4$, a metal silicide such as $TiSi_2$, $ZrSi_2$, $MoSi_2$, $WSi_2$, PtSi, $Mg_2Si$ or any other ceramic material; preferably wherein the second material comprises CrN and/or CrAlN.

Preferably the layer of second material has a thickness no greater than 10 μm, more preferably no greater than 5 μm, even more preferably no greater than 1 μm, even more preferably no greater than 100 nm, even more preferably no greater than 10 nm.

Preferably the information storage medium further comprises information encoded onto the writable plate in the form of localized areas of the second material which are preferably distinguishable from the surrounding second material. The writable plate can be stored long term with or without information encoded thereon.

Preferably localized areas of the second material have been laser or particle beam treated. Laser or particle beam ablation of the second material can completely remove it from localized areas. This can provide a (optically) distinguishable contrast between the manipulated areas and the surrounding second material.

Preferably information is distributed on the writable plate in information blocks, wherein each block is no larger than 100 mm×100 mm, more preferably no larger than 24 mm×36 mm, more preferably no larger than 10 mm×10 mm, more preferably no larger than 1 mm×1 mm, more preferably no larger than 0.1 mm×0.1 mm. Information blocks can help to organize information and present it in a manner easily readable by a digital scanner.

Preferably areas of the writable plate comprise at least 1 kilobyte of information per $cm^2$, more preferably at least 10 kilobytes of information per $cm^2$, even more preferably at least 100 kilobytes of information per $cm^2$, even more preferably at least 1 Megabytes of information per $cm^2$, even more preferably at least 10 Megabytes of information per $cm^2$, even more preferably at least 100 Megabytes of information per $cm^2$, even more preferably at least 1 Gigabytes of information per $cm^2$, even more preferably at least 10 Gigabytes of information per $cm^2$. Providing a high information density on the writable plate allows more information to be stored per plate and can reduce the costs of production.

Preferably the ceramic substrate has the shape of a tablet or a computer readable disk. A tablet or computer readable disk shape may allow computers or digital scanners to easily read the encoded information and to be compatible to existing scanning systems.

According to a fourth aspect, the invention relates to an information storage medium for long-term storage of information, the information storage medium comprising a writable plate, the writable plate comprising a tungsten substrate coated with a layer of second material and a sintered interface between the tungsten substrate and the layer of the second material, wherein the second material is different from the material of the substrate, wherein the sintered interface comprises at least one element from both the substrate material and the second material, wherein the layer of the second material has a thickness no greater than 10 μm.

Since alloys of Ni, Cr, Co, Fe, W, Mo or other metals with high melting point above 1,400° C. are extremely durable materials, the benefits discussed above with regard to the ceramic substrate may also be achieved by using alloys of Ni, Cr, Co, Fe, W, Mo or other metals with high melting point above 1,400° C. as substrate. All features discussed above with regard to the information storage medium according to the third aspect utilizing the ceramic substrate may also be employed in the context of the fourth aspect of the present invention by simply replacing the ceramic substrate with alloys of Ni, Cr, Co, Fe, W, Mo or other metals with high melting point above 1,400° C. as substrate.

According to a fifth aspect, the invention relates to a use of the information storage medium for long-term information storage.

Preferably, in use the writable plate is stored for a period of at least 1000 years, more preferably at least 10,000 years, even more preferably at least 100,000 years.

BRIEF DESCRIPTION OF THE DRAWINGS

The subject matter of the invention will be explained in more detail in the following text with reference to preferred exemplary embodiments which are illustrated in the attached drawings, in which.

In principle, identical parts are provided with the same reference signs in the figures.

DETAILED DESCRIPTION

Figure 1:
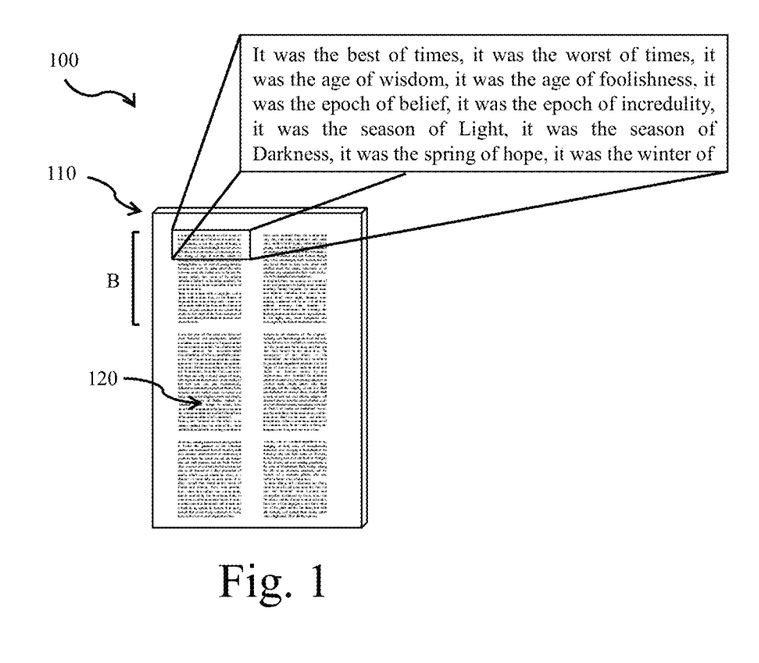
FIG. 1 schematically depicts an information storage medium for long-term storage of information.

FIG. 1 illustrates a schematic version of the information storage medium 100 according to the present invention. The information storage medium 100 includes a writable plate 110. In this example the writable plate 110 has been encoded with information 120.

In order to produce such an information storage medium 100, a method for long-term storage of information is described herein. Initially, a ceramic substrate 150 (see FIG. 3) is provided, then the ceramic substrate 150 is coated with a layer of a second material 170. The layer of second material 170 is no greater than 50 μm thick. After coating the ceramic substrate 150 and the second material 170 are subjected to a tempering process to form a writable plate 110. The writable plate may either be stored until ready for use or may subsequently be encoded with information 120 using, e.g., a laser 190. The laser 190 is directed toward the layer of second material 170 and then, e.g., heats localized areas of the second material 170 which fall within the beam of the laser beam such that these localized areas then become, e.g., optically distinguishable from the surrounding second material 170. This method will now be described in more detail.

The ceramic substrate 150 which is initially provided may comprise the majority of the material by weight of the writable plate 110. A number of different materials may be used for the ceramic substrate 150. In certain configurations the ceramic substrate 150 comprises an oxidic ceramic comprising at least one of $Al_2O_3$, $TiO_2$, $SiO_2$, $ZrO_2$, $ThO_2$, MgO, $Cr_2O_3$, $Zr_2O_3$, $V_2O_3$ or any other oxidic ceramic material. Alternatively, the ceramic substrate may comprise a non-oxidic ceramic comprising at least one of a metal nitride such as CrN, CrAlN, TiN, TiCN, ZrN, AlN, VN, $Si_3N_4$, ThN, HfN, BN; metal carbide such as TiC, CrC, $Al_4C_3$, VC, ZrC, HfC, ThC, $B_4C$, SiC; a metal boride such as $TiB_2$, $ZrB_2$, $CrB_2$, $VB_2$, $SiB_6$, $ThB_2$, $HfB_2$, $WB_2$, $WB_4$ and a metal silicide such as $TiSi_2$, $ZrSi_2$, $MoSi_2$, $WSi_2$, $PtSi$, $Mg_2Si$, or any other non-oxidic ceramic material. The amount of the oxidic or non-oxidic ceramic present may vary. Preferably the amount of oxidic or non-oxidic ceramic makes up at least 90% by weight of the ceramic substrate 150. More preferably the amount of the oxidic or non-oxidic ceramic substrate makes up at least 95% by weight of the ceramic substrate 150. One preferred configuration is a ceramic substrate 150 comprising at least 90% $Al_2O_3$ measured by weight.

The second material 170 is formed as a layer on the ceramic substrate 150. The layer of second material 170 is a thin layer in comparison with the thickness of the ceramic substrate 150, the second layer 170 being at most 50 μm thick. The second material 170 may principally comprise at least one of a metal such as Cr, Co, Ni, Fe, Al, Ti, Si, W, Zr, Ta, Th, Nb, Mn, Mg, Hf, Mo, V, a metal nitride such as CrN, CrAlN, TiN, TiCN, TiAlN, ZrN, AlN, VN, $Si_3N_4$, ThN, HfN, BN; a metal carbide such as TiC, CrC, $Al_4C_3$, VC, ZrC, HfC, ThC, $B_4C$, SiC; a metal oxide such as $Al_2O_3$, $TiO_2$, $SiO_2$, $ZrO_2$, $ThO_2$, MgO, $Cr_2O_3$, $Zr_2O_3$, $V_2O_3$; a metal boride such as $TiB_2$, $ZrB_2$, $CrB_2$, $VB_2$, $SiB_6$, $ThB_2$, $HfB_2$, $WB_2$, $WB_4$; a metal silicide such as $TiSi_2$, $ZrSi_2$, $MoSi_2$, $WSi_2$, $PtSi$, $Mg_2Si$ or any other ceramic material; preferably wherein the second material comprises CrN and/or CrAlN.

One preferred configuration is a layer of second material 170 comprising principally CrN and/or CrAlN. Importantly, the material used for the second layer 170 provides a sufficient degree of, e.g., optical contrast with the material of the ceramic substrate 150 after tempering.

The degree of optical contrast may be visible to a human observer in terms of color and/or brightness. Alternatively, the optical contrast may be detected by an automated system in non-visible wavelengths. The localized areas may then be optically distinguishable by means of an optical reader or scanner being sensitive in the respective portion of the spectrum. The optical contrast may be measured using Weber contrast, wherein the Weber contrast fraction of the information encoded on the writable plate is preferably at least 1%, more preferably at least 3%, more preferably at least 5%. However, in other instances (in particular, if the encoded structures are too small) the localized areas may only be distinguished from the surrounding material by means of, e.g., a scanning electron microscope or measurement of another physical parameter change.

Figure 2:
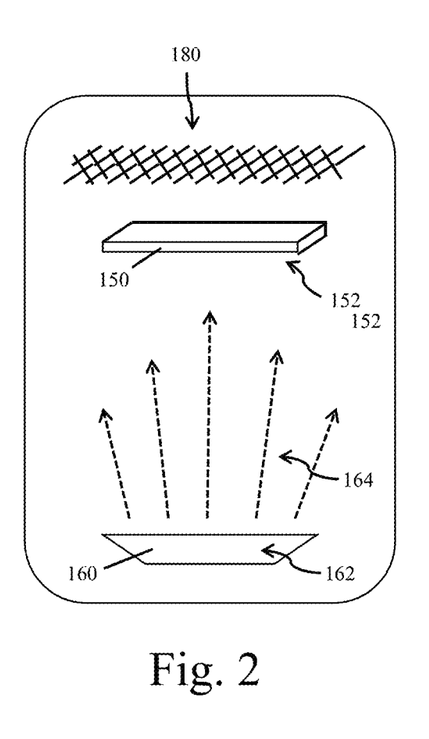
FIG. 2 schematically depicts an example of the process of physical vapor deposition coating of the ceramic substrate.

FIG. 2 illustrates an exemplary method for coating the second material 170 onto the ceramic substrate 150 using physical vapor deposition (PVD). In the PVD process the ceramic substrate 150 is placed into a physical vapor deposition chamber together with a source of second material 160. A vacuum is drawn on the physical vapor deposition chamber and the source of second material 160 is heated until a significant portion of the second material 162 contained therein is evaporated or sublimated. The airborne particles 164 of second material then disperse throughout the physical vapor deposition chamber until they contact a surface 152 of the ceramic substrate 150 and adhere thereto.

Although physical vapor deposition is a method commonly used for coating metal substrates, coating ceramic substrates can prove challenging for particles to adhere to. Thus, in order to improve adherence of second material particles 164 to the ceramic substrate surface 152, a conductive wire mesh or conductive metal plate 180 may be placed on the far side of the ceramic substrate 150, such that the ceramic substrate 150 is positioned in between the wire mesh 180 and the source of second material 160. Such a conductive mesh/plate 180 when conducting current may attract ionized particles of second material 164 which then encounter the surface 152 of the ceramic substrate 150 and are held there against such that they then adhere to the surface 152 of the ceramic substrate. This coating process may also be repeated in order to coat multiple different surfaces of the ceramic substrate.

Depositing a layer of second material 170 on the ceramic substrate 150 may be performed using other coating methods, such as sputtering or sublimation sandwich coating. Essentially, any method capable of producing a layer of second material 170 maximally 50 μm thick may be used. Preferably the layer of second material may have a thickness of maximally 10 μm. More preferably the second material 170 may have a maximal thickness of 5 μm. Even more preferably, the second material 170 may have a maximal thickness of 1 μm, even more preferably no greater than 100 nm, even more preferably no greater than 10 nm. A thin layer of second material 170 may be advantageous in that laser or particle beam ablation of the writable plate 110 may then be easier, resulting in a faster, less energy-intensive encoding process. The second material 170 may not necessarily cover the entire ceramic substrate 150. Instead only portions of the ceramic substrate 150 or a singular side 152 of the ceramic substrate 150 may be coated with the second material 170.

Once the ceramic substrate 150 is coated with a second material 170, the coated ceramic substrate then undergoes a tempering process. Tempering is generally understood to be a process which improves the strength and/or other qualities of a material. In the case of ceramics, tempering can involve heating a ceramic item such that the chemical components thereof undergo chemical and/or physical changes such that the item becomes fixed or hardened. Tempering of the coated ceramic substrate may involve heating the coated ceramic substrate 150 to a temperature within a range of 200° C. to 4000° C., preferably within a range of 1000° C. to 2000° C. The tempering process may comprise a heating phase with a temperature increase of at least 10 K per hour, a plateau phase at a peak temperature for at least 1 minute and finally a cooling phase with a temperature decrease of at least 10 K per hour. The tempering process may assist in fixing the second material 170 permanently to the ceramic substrate 150. In some cases, a portion of the second material layer 170 may form a chemical bond to the underlying ceramic substrate 150. After tempering the ceramic substrate 150 with the second material 170, the writable plate 110 is formed. The properties of the writable plate 110 are determined by the exact materials used within the writable plate 110. The writable plate 110 may now be stored or directly encoded with information 120.

Figure 3:
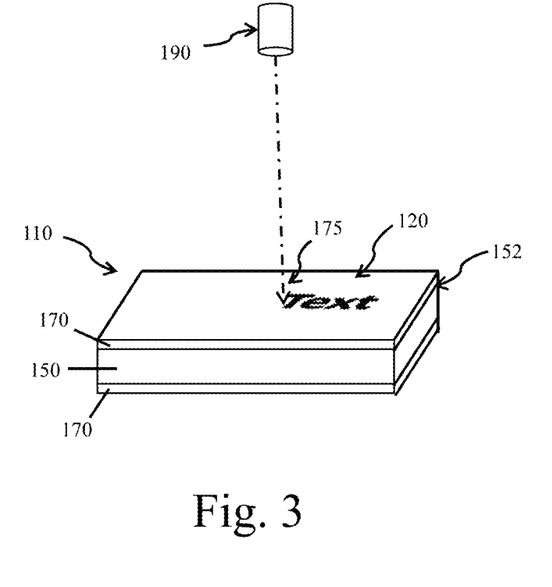
FIG. 3 schematically shows a perspective view of an example of encoding the writable plate with information using a laser.

FIG. 3 depicts the encoding of information onto the writable plate 110. During encoding, a laser 190 directs collimated laser light onto a layer of second material 170 of the writable plate 110. The laser beam alters the portion of second material 170 within the localized area 175 such that it is (optically) distinguishable from the surrounding second material 170. Preferably the laser or focused particle beam heats the localized area 175 of the second material 170 to at least the melting temperature of the second material 170. The melting point of the second material 170 is dependent on the chemical composition thereof. Preferably, heating the localized areas 175 past the melting point may involve heating the localized areas to a temperature of at least 3,000° C., more preferably at least 3,200° C., and even more preferably at least 3,500° C., most preferably at least 4,000° C. Imparting these localized areas with such high temperatures may cause a rapid expansion of the second material 170 within the localized areas 175. This rapid expansion can cause the second material 170 within the localized areas 175 to be ablated and/or vaporized. As the second material 170 provides an optical contrast to the underlying ceramic substrate 150, the localized areas 175 can be formed by the laser or focused particle beam into symbols, letters, lines, photographs, pictures, images, graphics or other forms, thereby encoding information into the writable plate 110. Preferably, the encoded information 120 relative to the rest of the second material 170 exhibits a Weber contrast fraction of at least 1%, more preferably at least 3%, more preferably at least 5%. In a preferred configuration the second material 170 after tempering exhibits an opaque gray/black color and the ceramic substrate 150 exhibits a yellow/white color. Thus, following laser or focused particle beam encoding, the information storage medium 100 exhibits white lettering/symbols relative to a dark background.

Suitable laser wavelengths for the laser encoding methods may include a wavelength within a range of 10 nm to 30 μm, preferably within a range of 100 nm to 2000 nm, more preferably within a range of 200 nm to 1500 nm. Of further importance is the minimum focal diameter of the laser light or focused particle beam which dictates the minimum size of symbols, letters, photographs, pictures, images, graphics and/or other forms which can be encoded on the writable plate 110. Preferably the laser or focused particle beam 190 is capable of focusing the laser light or focused particle beam to have a minimum focal diameter no greater than 50 μm, preferably no greater than 15 μm, more preferably no greater than 10 μm. Under such conditions a resolution of 2,500 dpi is possible, enabling the encoding of 5,000 symbols/letters within a space of 1 cm$^2$. This can also result in being able to print 1000 pages of a book (~2 million symbols/letters) with 2,000 letters per page within a single 20 cm×20 cm writable plate.

Reading out the encoded text can be performed by eye if the letters/symbols are large enough. Preferably the encoded information could be read out through using a digital scanner using methods such as optical character recognition (OCR) among other methods. Such a digital scanner can quickly and accurately reproduce the encoded information in a size more accessible for human reading. As previously mentioned, the information 120 may be encoded on the writable plate 110 using a number of different formats. The information 120 may be encoded in a human-readable format using letters, symbols, photographs, pictures, images, graphics and/or other forms. The information 120 may also be encoded in a computer-readable format using, for instance, a QR code or an iQR code and or any other digital coding and encryption method. The use of such computer-readable encoding methods may serve to further increase the information density of the information storage medium 100. For example, the iQR code can enable 40,000 characters to be stored within 1 cm$^2$, or equivalently 8-16 megabytes on a 20 cm×20 cm writable plate. Preferably the writable plate can store a minimum of 1 kilobyte of information per cm$^2$, more preferably at least 10 kilobytes of information per cm$^2$, and even more preferably at least 100 kilobytes of information per cm$^2$, even more preferably at least 1 Megabytes of information per cm$^2$, even more preferably at least 10 Megabytes of information per cm$^2$, even more preferably at least 100 Megabytes of information per cm$^2$, even more preferably at least 1 Gigabytes of information per cm$^2$, even more preferably at least 10 Gigabytes of information per cm$^2$.

For ease of reading and/or scanning, information may be encoded onto the writable plate within distinct blocks. These blocks of information, indicated as B in FIG. 1, are preferably no larger than 100 mm by 100 mm, more preferably no larger than 24 mm by 36 mm, more preferably no larger than 10 mm by 10 mm, more preferably no larger than 1 mm by 1 mm, more preferably no larger than 0.1 mm by 0.1 mm.

The form of the writable plate 110 can be determined by the needs of the user and the types of information 120 to be encoded. In some instances, the writable plate 110 can be formed in a tablet shape for storage, preferably no larger than 200 mm by 200 mm, more preferably no larger than 100 mm by 100 mm, more preferably no larger than 10 mm by 10 mm. In other instances a computer readable disk-shape may be preferable with a diameter no larger than 30 cm, more preferably no larger than 12 cm, more preferably no larger than 8 cm.

The information storage medium 100 according to the present invention is resistant to environmental degradation and is preferably able to withstand temperatures between −273° C. (0° K) and 1200° C. without suffering information loss. The information storage medium 100 may also resist electro-magnetic pulses, water damage, corrosion, acids and/or other chemicals. It is envisioned that the information storage medium 100 as herein described could preserve information 120 for a time period of at least 1000 years, preferably at least 10,000 years, more preferably at least 100,000 years. Under certain conditions of storage, including storage of the information storage medium 100 within an underground salt dome, the information storage medium may be able to preserve information for at least 1 million years.

One particularly preferred example will be described in the following.

A ceramic substrate made of Rubalit 708s containing at least 96% $Al_2O_3$ having the dimensions of 20 cm×20 cm available at CeramTec GmbH (Germany) was used as the raw material.

A plate of said ceramic substrate having the size of 10 cm×10 cm and a thickness of 1 mm was coated with a layer of CrN using physical vapor deposition. For this purpose, the ceramic plate was mounted on an electrically conductive plate made from steel with a size of 10 cm×10 cm. The ceramic plate together with the electrically conductive plate was brought into a physical vapor deposition machine available from Oerlikon Balzers AG (Lichtenstein).

Physical vapor deposition was then performed using the enhanced sputtering process BALI-NIT® CNI from Oerlikon Balzers AG at a process temperature below 250° C.

After the deposition, a layer of CrN with a constant thickness of 3 μm was present on one side of the ceramic substrate (opposite to the side facing the electrically conductive plate).

Subsequently, the coated ceramic substrate was tempered in a batch furnace model "N 150/H" available from Nabertherm GmbH. For tempering, the temperature was ramped up from room temperature (20° C.) to 1,000° C. within 2 h. The temperature was then increased with a rate of 100 K/h from 1,000° C. to 1,200° C. and the maximum temperature of 1,200° C. was maintained for 5 min. Subsequently, the substrate was cooled down with a rate of −200 K/h over 6 h.

After tempering, the stack of material comprised the ceramic substrate, a coating layer of CrN having a thickness of about 2-2.5 μm and a further metal oxide layer of $Cr_2O_3$ having a thickness of about 0.5-1 μm. Similar metal oxide layers have been described in Z. B. Qi et al. (Thin Solid Films 544 (2013), 515-520).

The metal oxide surface had a darkish, almost black appearance.

Using a ProMarker 100 laser available from Trotec Laser GmbH (Austria) a text with single line font and a QR code was written into the two upper coatings. For this purpose, pulses of 100 ns at a wavelength of 1064 nm with a power of maximal 5W were applied at a frequency of 20 kHz.

The laser light was focused by a lens with a focal length of 100 mm. The focus of the laser light had a width of about 25 μm yielding encoded structured of a width of about 15 μm or 1,750 dpi micro inscription.

Figure 4:
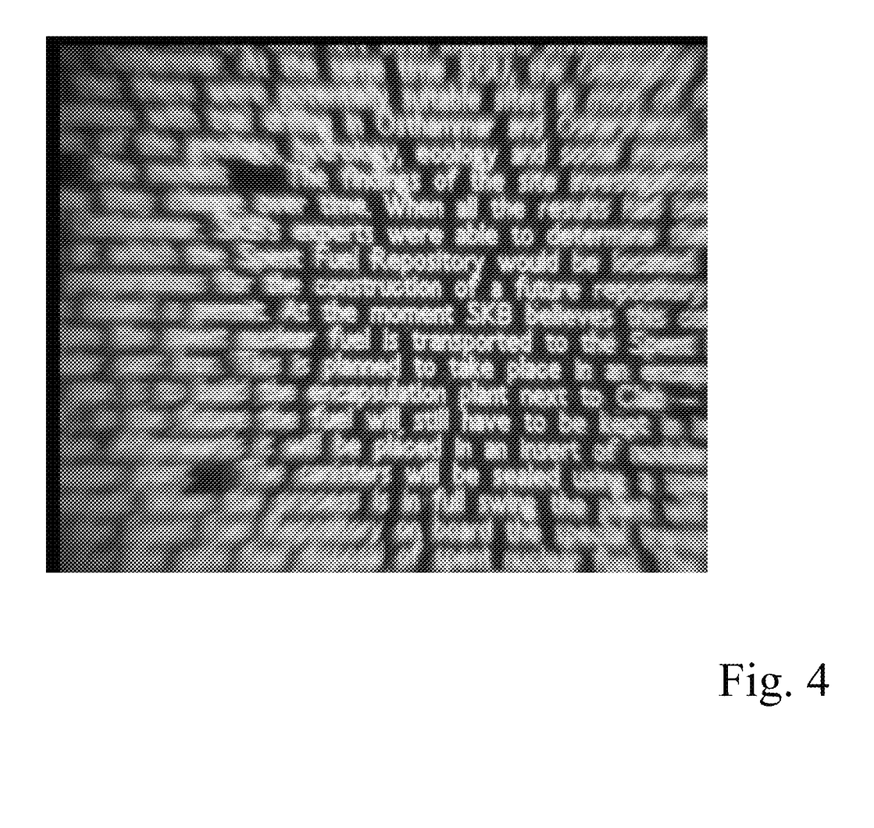
FIG. 4 shows a photograph of an inscribed product according to an example.

The encoded lines/surfaces had a light, almost white appearance and were clearly visible vis-à-vis the dark metal oxide surrounding surface. A photograph showing a detail of the inscribed product is shown in FIG. 4.

While the invention has been illustrated and described in detail in the drawings and foregoing description, such illustration and description are to be considered illustrative or exemplary and non-restrictive; the invention is thus not limited to the disclosed embodiments. Variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality and may mean "at least one".

The invention claimed is:

1. A method for storage of information comprising:
providing a ceramic substrate comprising a first material;
coating the ceramic substrate with a layer of a second material different from the first material of the ceramic substrate, the layer having a thickness no greater than 10 μm, wherein the second material comprises a metal carbide, a metal oxide, a metal nitride, a metal silicide, or a metal boride;
tempering the coated ceramic substrate to form a writable plate; and
encoding information on the writable plate by using a laser and/or a focused particle beam to manipulate localized areas of the writable plate.

2. The method of claim 1, wherein the ceramic substrate first material comprises an oxidic ceramic.

3. The method of claim 1, wherein the first material comprises a non-oxidic ceramic.

4. The method of claim 1, wherein the first material comprises one or a combination of Ni, Cr, Co, Fe, W, Mo.

5. The method of claim 1, wherein the first material comprises a ceramic material and a metal that form a metal matrix composite.

6. The method of claim 1, wherein physical vapor deposition, sputtering, or chemical vapor deposition is used to coat the ceramic substrate with the layer of the second material.

7. The method of claim 1, wherein manipulating the localized areas of the writable plate comprises heating, decomposing, oxidizing, ablating or vaporizing the localized areas.

8. The method of claim 1, wherein manipulating the localized areas of the writable plate causes the layer of the second material to be at least partly removed from the localized areas of the writable plate.

9. The method of claim 1, wherein tempering the coated ceramic substrate generates a sintered interface between the ceramic substrate and the layer of the second material.

10. The method of claim 1, wherein tempering the coated ceramic substrate causes oxidation of at least a topmost sub-layer of the layer of the second material.

11. The method of claim 10, wherein manipulating the localized areas of the writable plate causes the oxidized sub-layer to be at least partly removed from the localized areas of the writable plate.

* * * * *

UNITED STATES PATENT AND TRADEMARK OFFICE
CERTIFICATE OF CORRECTION

Page 1 of 1

PATENT NO. : 11,007,606 B2
APPLICATION NO. : 16/912219
DATED : May 18, 2021
INVENTOR(S) : Martin Kunze et al.

It is certified that error appears in the above-identified patent and that said Letters Patent is hereby corrected as shown below:

In the Claims

Column 14, Line 23, in Claim 2, after "wherein the" delete "ceramic substrate."

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*